(12) United States Patent
Jeitner et al.

(10) Patent No.: US 7,674,993 B2
(45) Date of Patent: Mar. 9, 2010

(54) OPERATING ELEMENT FOR A MOTOR VEHICLE

(75) Inventors: Martin Jeitner, Ostheim (DE); Andreas Kramlich, Schweinfurt (DE); Peter Kraus, Bergreinfeld (DE); Volker Gessner, Salz (DE)

(73) Assignee: PREH GmbH (DE)

( * ) Notice: Subject to any disclaimer, the term of this patent is extended or adjusted under 35 U.S.C. 154(b) by 0 days.

(21) Appl. No.: 12/025,693

(22) Filed: Feb. 4, 2008

(65) Prior Publication Data

US 2008/0142353 A1 Jun. 19, 2008

Related U.S. Application Data

(63) Continuation of application No. PCT/EP2006/007690, filed on Aug. 3, 2006.

(30) Foreign Application Priority Data

Aug. 3, 2005 (DE) .................... 10 2005 036 386

(51) Int. Cl.
*H03K 17/975* (2006.01)

(52) U.S. Cl. .................. 200/600; 345/173; 349/150; 341/22

(58) Field of Classification Search .................. 200/600; 341/22–23; 345/156, 168, 169, 173
See application file for complete search history.

(56) References Cited

U.S. PATENT DOCUMENTS

| 5,892,652 | A | * | 4/1999 | Bony et al. | .................. 361/291 |
| 6,417,533 | B2 | * | 7/2002 | Kawata et al. | .............. 257/296 |

FOREIGN PATENT DOCUMENTS

| DE | 3906859 C1 | 8/1990 |
| DE | 3910977 A1 | 10/1990 |
| DE | 19946471 A1 | 3/2001 |
| DE | 20311127 U1 | 11/2003 |
| EP | 0780865 A1 | 6/1997 |
| EP | 1635366 A1 | 3/2006 |
| FR | 2183712 A1 | 12/1973 |

* cited by examiner

*Primary Examiner*—Kyung Lee
(74) *Attorney, Agent, or Firm*—Cantor Colburn LLP

(57) ABSTRACT

The invention concerns an operating element, in particular a pushbutton, for a motor vehicle, having at least of a touch-sensitive pushbutton operating on a capacitive basis and a housing, wherein the pushbutton is movably mounted in the housing, wherein a capacitor that forms the capacitance is composed of a metallic area applied to an inner or outer side of a surface facing the user, and the metallic area forms an electrode of the capacitor that is electrically contacted in the housing.

13 Claims, 2 Drawing Sheets

OPERATING ELEMENT FOR A MOTOR VEHICLE

This nonprovisional application is a continuation of International Application No. PCT/EP2006/007690, which was filed on Aug. 3, 2006, and which claims priority to German Patent Application No. DE 102005036386, which was filed in Germany on Aug. 3, 2005, and which are both herein incorporated by reference.

BACKGROUND OF THE INVENTION

1. Field of the Invention

The present invention relates to an operating element, in particular a pushbutton, for a motor vehicle, including at least of a touch-sensitive pushbutton operating on a capacitive basis and a housing, wherein the pushbutton is movably mounted in the housing.

2. Description of the Background Art

It is known to make keys or operating elements with capacitive elements so that a function connected with the key can be selected and/or actuated by means of an electronic analysis unit when the key is touched. By way of example, a touch-sensitive momentary switch operating on a capacitive basis is described in DE 203 11 127 as an input option for computer systems or electronic devices. In this design, a point illumination unit for the key surface in the form of a self-luminous display is applied to the back of a support plate, and a capacitive, touch-sensitive input option is arranged on the front as the touch surface.

Another touch-sensitive key is described in EP 0 780 865. This document describes a device with a key that is sensitive due to capacitive action for detecting the presence of an element through an electrically insulating plate, wherein the key is carried by a printed circuit board that is essentially parallel to the plate and is electronically connected to an electronic sensing circuit arranged on the printed circuit board. One electrode of this electrical assembly is composed of a spring leaf, which is made of an electrically conductive material and has a base plate that is affixed to the printed circuit board.

SUMMARY OF THE INVENTION

It is therefore an object of the present invention to provide a pushbutton that is movably held in an operating element that is simple in construction and economical to manufacture. It is a further object to provide a pushbutton whose electronic contacts influence the haptics of the pushbutton either not at all or only to an insignificant degree.

The object of the invention is attained in that a capacitor, which forms the capacitance, includes a metallic area applied to an inner or outer side of a surface facing the user, and the metallic area forms an electrode of the capacitor that is electrically contacted in the housing. As a result of the inventive construction of the pushbutton, it is now possible to provide an operating element that has a simple construction and is thus economical to manufacture. In this regard, the minimized manufacturing effort includes that only one surface of the pushbutton is either metallized or provided with, for example, a metallic foil, which in turn is electronically contacted in the housing of the operating element. As a result of the application or attachment of a metallic area to the pushbutton, a pushbutton is made available with the least possible effort, and hence economically, said pushbutton being equipped with an electrode that forms the first electrode of a capacitor, wherein the second electrode is composed by the user, and preferably the finger of the user.

In an embodiment of the invention, an additional capacitor is provided in the operating element between a side wall, which is arranged parallel to a housing wall of the operating element. This measure provides the inventive advantage that the electrode formed on the surface of the pushbutton is contacted in the housing in a touchless position. This, in turn, provides the advantage that the haptics of the pushbutton are not affected by the capacitor elements and their electrical contacts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
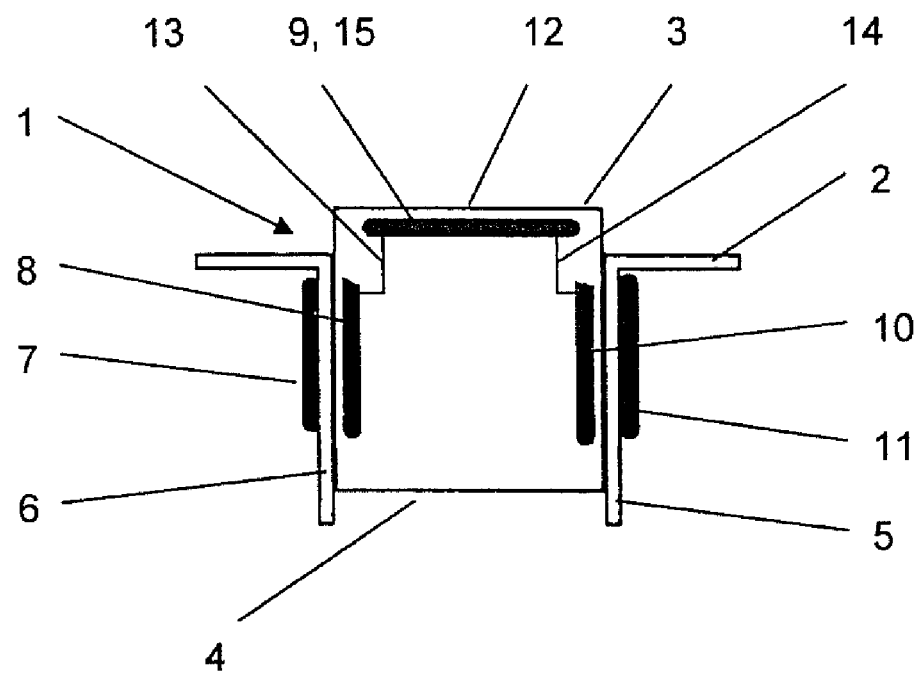
FIG. 1 illustrates a section through an operating element of inventive design with a pushbutton in side view.

FIG. 1 shows the side view of a part of an operating element 1 of a motor vehicle, wherein the operating element 1 is, for example, a momentary switch for an air conditioning system, a fan, a seat heater, etc. Only portions of the operating element are shown; it includes a housing 2 and a pushbutton 3 movably arranged in the housing 2. For example, the pushbutton is resiliently fastened in the housing 2 by means of guides (not shown) in the housing 2 so as to be movable against a compression spring or the spring force of a momentary switch located below the pushbutton 3, so that the pushbutton 3 assumes its rest position when in the position shown in FIG. 1. The housing 2 contains an opening 4 that is formed by the side walls 5, 6 in the side view. The electrodes 7, 8, 9, 10, 11 of the capacitors are shown as black bars in FIG. 1.

Figure 3:
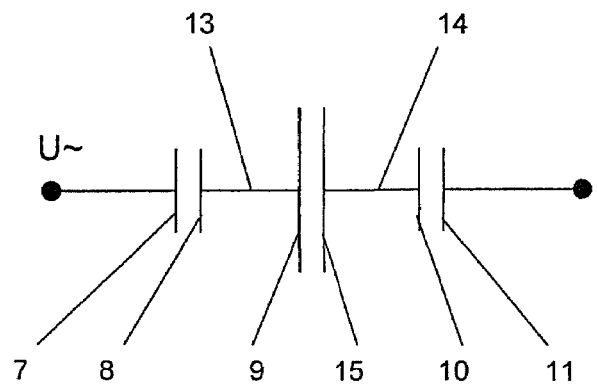
FIG. 3 illustrates a circuit design of a special embodiment from FIGS. 1 and 2.

In this connection, the electrode 9 on the surface 12 of the pushbutton 3 forms the electrode, which detects an approach of a user's finger, and hence initiates a function in the electronics of the motor vehicle. The electrode pairs 7, 8 and 10, 11 form coupling capacitors, by means of which touchless electrical contact is made to the electrode 9. To this end, the electrodes 8, 10 are electrically connected to the electrode 9 by the lines 13, and to an electrode 15 by the line 14. If two electrodes 9, 15 are formed on the surface, the result is the schematic circuit diagram from FIG. 3, for example.

In this example embodiment, each of the electrodes 7, 8, 9, 10, 11, 15 are arranged on the inside of the pushbutton 3 and housing 2. However, it is equally possible according to the invention to position the electrodes 7, 8, 9, 10, 11, 15 directly on the outer surface of the side walls 5, 6 of the housing and/or the inner surfaces of the pushbutton 3.

One advantage that results from the construction of the inventive operating element 1 shown in FIG. 1 is that capacitance changes are compensated by the opposing electrodes 7, 8, 10, 11 if the pushbutton 3 is not pushed into the housing 2 in a linear position. The electrodes 7, 8, 9, 10 arranged on opposite sides thus compensate tilting of the pushbutton 3 in the housing 2.

Figure 2:
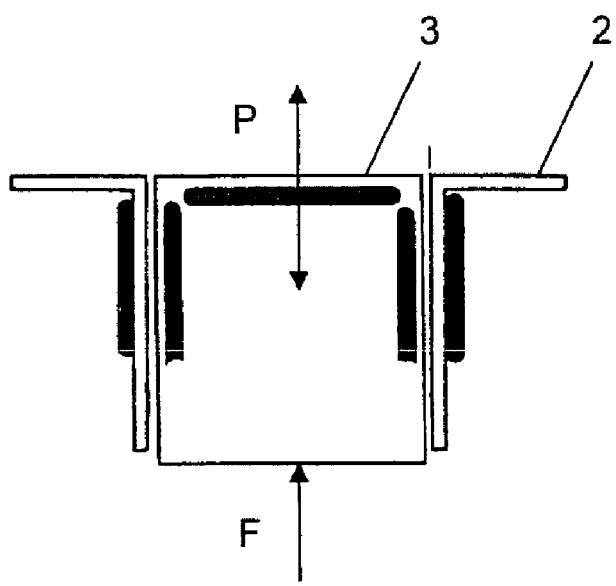
FIG. 2 illustrates an operating element with inventive pushbutton in section, and in side view in the depressed state.

When the inventive operating element 1 is pushed into the housing 2 by a finger at the surface 12 in the direction of the arrow P against the force F of a spring or of an electrical component, such as a momentary switch or a contact mat, for example, the result is the position of the pushbutton 3 as shown in FIG. 2. The pushbutton 3, and in particular the capacitor 9, operates in a proximity-sensitive and touch-sensitive manner, so that even as the button surface 12 is approached, the capacitance changes and increases disproportionately with proximity to the button 3; when the user's finger touches the pushbutton 3, the electrical capacitance of the capacitor 9 changes in turn, which can be evaluated electronically. Sensing of approach is especially important, for example, when operating elements 1 outside the motor vehicle driver's field of view are contacted. One example of such an operating element 1 is a seat adjuster. When the user contacts this seat adjuster with a finger, this can be detected by means of the electrode 9 as a change in the capacitive field of the capacitor 9, 15, and a visualization of the operating element 1 can be shown in a display of the motor vehicle by means of a subsequent circuit, for example. The touch or the selection of the required operating element 1 can thus be indicated to the user in the display. This provides the inventive advantage that the required operating element 1 can be selected solely by touch.

If the pushbutton 3 is then pushed into the housing 2 in the position shown in FIG. 2, an additional displacement of the capacitor plates 7, 8, 10, 11 occurs as a result of the mechanical forces, and there is a capacitance change that can be detected by measurement means. Thus, not only is the voltage supply to the electrode 9 of the surface capacitor 9, 15 ensured, but a switching function associated with the pushbutton 3 can also be monitored or evaluated.

The inventive design of a pushbutton 3 provides a pushbutton 3 that is considerably more resistant to impact, shock, vibration, and aging-related wear. In contrast to prior art pushbuttons 3 designed using fixed contacts, the inventive pushbutton 3 is not subject to contact erosion and/or corrosion.

Figure 4:
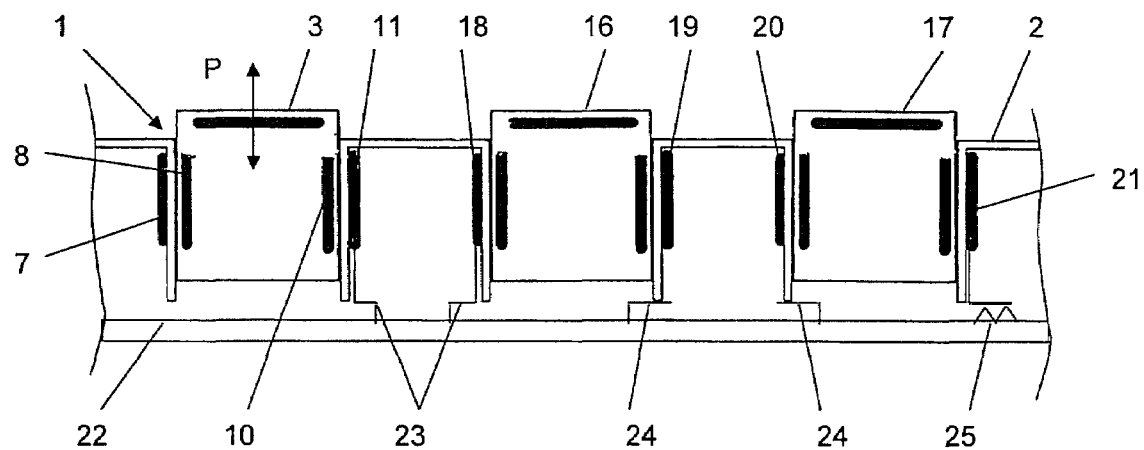
FIG. 4 illustrates a design of an operating element with multiple inventive pushbuttons, likewise in side view.

FIG. 4 shows an operating element 1 in which three pushbuttons 3, 16, 17 are arranged next to one another in a housing 2. The electrodes 7, 11, 18, 19, 20, 21 here can contact a printed circuit board 22 arranged beneath the pushbuttons 3, 16, 17 by means of a wide variety of electrical terminals. Contact is possible by means of soldered contacts 23, by means of pressed-in contacts such as, e.g., wiper contacts or surface potentiometers 24, or by means of pins 25.

The invention permits a compact design of an operating element 1, wherein moving parts 3, 16, 17 need not be contacted through spring contacts or lines. The haptics of the pushbutton 3, 16, 17 are thus unaffected.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An operating element for a motor vehicle comprising:
   at least one pushbutton operating on a capacitive basis and is proximity sensitive and touch sensitive;
   a housing, the pushbutton being configured to be movably mounted in the housing; and
   a capacitor forming the capacitance, the capacitor having a metallic area applied to an inner or outer side of a surface facing the user, the metallic area forming an electrode of the capacitor that is electrically contacted in the housing.

2. The operating element according to claim 1, wherein the capacitor is composed of two areas, each of which constitutes an electrode of the capacitor, applied to the inside or outside.

3. The operating element according to claim 1, wherein at least one first electrode is provided on an inside or outside of a wall of an opening in the housing that is parallel to the pushbutton, and a second electrode is provided on the pushbutton to create a coupling capacitor, wherein the coupling capacitor is connected in series with the capacitor provided at the surface.

4. The operating element according to claim 1, wherein a coupling capacitor is provided at each opposite side of the pushbutton.

5. The operating element according to claim 1, wherein the electrode is composed of a metallic layer applied by a PVD process.

6. The operating element according to claim 1 wherein the at least one pushbutton includes a first wall, the housing includes a second wall parallel and opposed to the first wall, and wherein the first wall slides relative to the second wall when the pushbutton is pressed into the housing.

7. The operating element according to claim 1 wherein an actuating portion of the at least one pushbutton adapted to be engaged by a user is located outside the housing.

8. The operating element according to claim 1 wherein the at least one pushbutton includes a wall portion and wherein the at least one pushbutton is shiftable between a first position wherein the wall portion projects from the housing and a second position wherein the wall portion is inside the housing.

9. The operating element according to claim 1 wherein the pushbutton includes a wall portion and wherein the pushbutton is shiftable between a first position wherein the wall portion projects from the housing and a second position wherein the wall portion is inside the housing.

10. An operating element for a motor vehicle comprising:
    a housing;
    a pushbutton movably mounted in the housing and having a contact surface adapted to be contacted by a user actuating the pushbutton; and
    a capacitor comprising a first plate member on an inner or outer side of the contact surface and a second plate member inside the housing and electrically connected to the first plate member;
    whereby, the operating element is both proximity sensitive and touch sensitive.

11. The operating element of claim 10 further including a third plate member mounted on the housing adjacent the second plate member.

12. The operating element according to claim 10 wherein the pushbutton includes a first wall, the housing includes a second wall parallel and opposed to the first wall, and wherein the first wall slides relative to the second wall when the pushbutton is pressed into the housing.

13. The operating element according to claim 10 wherein an actuating portion of the pushbutton adapted to be engaged by a user is located outside the housing.

* * * * *